(12) United States Patent
Degura

(10) Patent No.: US 10,178,820 B2
(45) Date of Patent: Jan. 8, 2019

(54) BOARD WORK MACHINE AND RECOGNITION METHOD

(71) Applicant: FUJI CORPORATION, Chiryu-shi (JP)

(72) Inventor: Kazuya Degura, Chiryu (JP)

(73) Assignee: FUJI CORPORATION, Chiryu-shi (JP)

( * ) Notice: Subject to any disclaimer, the term of this patent is extended or adjusted under 35 U.S.C. 154(b) by 0 days.

(21) Appl. No.: 15/735,217

(22) PCT Filed: Jun. 30, 2015

(86) PCT No.: PCT/JP2015/068763
§ 371 (c)(1),
(2) Date: Dec. 11, 2017

(87) PCT Pub. No.: WO2017/002187
PCT Pub. Date: Jan. 5, 2017

(65) Prior Publication Data
US 2018/0184553 A1   Jun. 28, 2018

(51) Int. Cl.
*G06K 7/14* (2006.01)
*H05K 13/00* (2006.01)
*H05K 13/04* (2006.01)
*G06K 7/10* (2006.01)
*H05K 13/08* (2006.01)

(52) U.S. Cl.
CPC ..... *H05K 13/0092* (2013.01); *G06K 7/10722* (2013.01); *G06K 7/1417* (2013.01); *H05K 13/04* (2013.01); *H05K 13/08* (2013.01)

(58) Field of Classification Search
CPC . A61B 17/1764; A61B 17/154; Y10T 407/23; Y10T 407/235
USPC ................................. 235/454; 407/113, 114
See application file for complete search history.

(56) References Cited

U.S. PATENT DOCUMENTS

| | | | | |
|---|---|---|---|---|
| 6,123,488 A | * | 9/2000 | Kasperik | ............... B23B 27/141 407/113 |
| 8,746,115 B2 | * | 6/2014 | Hecht | ..................... B23C 5/207 407/113 |
| 2010/0229380 A1 | | 9/2010 | Endo et al. | |

FOREIGN PATENT DOCUMENTS

| | | |
|---|---|---|
| JP | 2002-261493 A | 9/2002 |
| JP | 2004-327570 A | 11/2004 |
| JP | 2006-351682 A | 12/2006 |

(Continued)

OTHER PUBLICATIONS

International Search Report dated Oct. 6, 2015 in PCT/JP2015/068763 filed Jun. 30, 2015.

*Primary Examiner* — Jamara Franklin
(74) *Attorney, Agent, or Firm* — Oblon, McClelland, Maier & Neustadt, L.L.P.

(57) ABSTRACT

A cut and clinch device includes a movable section slidable with respect to a main body section. A first insertion hole is formed in main body section, and a second insertion hole is formed in the movable section. A lead is cut by the movable section being slid with the lead inserted into the first insertion hole and the second insertion hole. A recognition mark is provided on the movable section and the main body section, and the types of the movable section and the main body section are recognized based on image data of the recognition marks. By this, it is possible to appropriately check the type of the portion that cuts a lead.

4 Claims, 10 Drawing Sheets

(56) References Cited

FOREIGN PATENT DOCUMENTS

| | | |
|---|---|---|
| JP | 2009-117734 A | 5/2009 |
| WO | 2015/063827 A1 | 5/2015 |

* cited by examiner

BOARD WORK MACHINE AND RECOGNITION METHOD

TECHNICAL FIELD

The present invention relates to a cutting device with a cutting tool configured to cut a lead of a leaded component inserted into an insertion hole, and to a recognition method for recognizing a type of the cutting tool.

BACKGROUND ART

A cutting device that cuts a lead of a leaded component, for example, includes a cutting tool in which an insertion hole is formed, and cuts a lead that is inserted into the insertion hole. The patent literature below discloses an example of a cutting device configured as such.

Patent literature 1: JP-A-2002-261493

SUMMARY OF INVENTION

Technical Problem

In the above-configured cutting device, a cutting tool is attached to a main body section in a removable manner, such that with the cutting device, the cutting tool is exchanged in accordance with the leaded component to be cut. Because exchanging of cutting tools is usually performed manually by an operator, it is desirable to check the type of cutting tool attached to the main body section. Thus, an object of the present invention is to appropriately check the type of the cutting tool.

Solution to Problem

To solve the above problems, a board work machine of the present invention includes: a cutting tool including a cutting tool configured to cut a lead of a leaded component inserted into an insertion hole formed in the cutting tool, and a main body section to which the cutting tool is removably attached; an imaging device; and a control device, wherein a mark for recognizing a type of the cutting tool is provided on the cutting tool, and the control section includes an imaging section configured to capture an image of the recognition mark using the imaging device, and a recognizing section configured to recognize the type of the cutting tool based on image data obtained from the imaging section.

Also, to solve the above problems, a recognition method of the present invention includes: imaging a recognition mark provided on a cutting tool using an imaging device, the recognition being for recognizing a type of the cutting tool, and the cutting tool being included in a cutting device including the cutting tool configured to cut a lead of a leaded component inserted into an insertion hole formed in the cutting tool, and a main body section to which the cutting tool is removably attached; recognizing the type of the cutting tool based on image data obtained from the imaging.

Advantageous Effects

With the board work machine and recognition method disclosed of the present invention, a recognition mark for recognizing the type of the cutting tool is provided on the cutting tool. And, the type of the cutting tool is recognized based on image data of the recognition mark. Thus, it is possible to appropriately check the type of the cutting tool.

DESCRIPTION OF PREFERRED EMBODIMENTS

The following describes in detail referring to the figures an example embodiment of the present invention.

Configuration of Component Mounter

Figure 1:
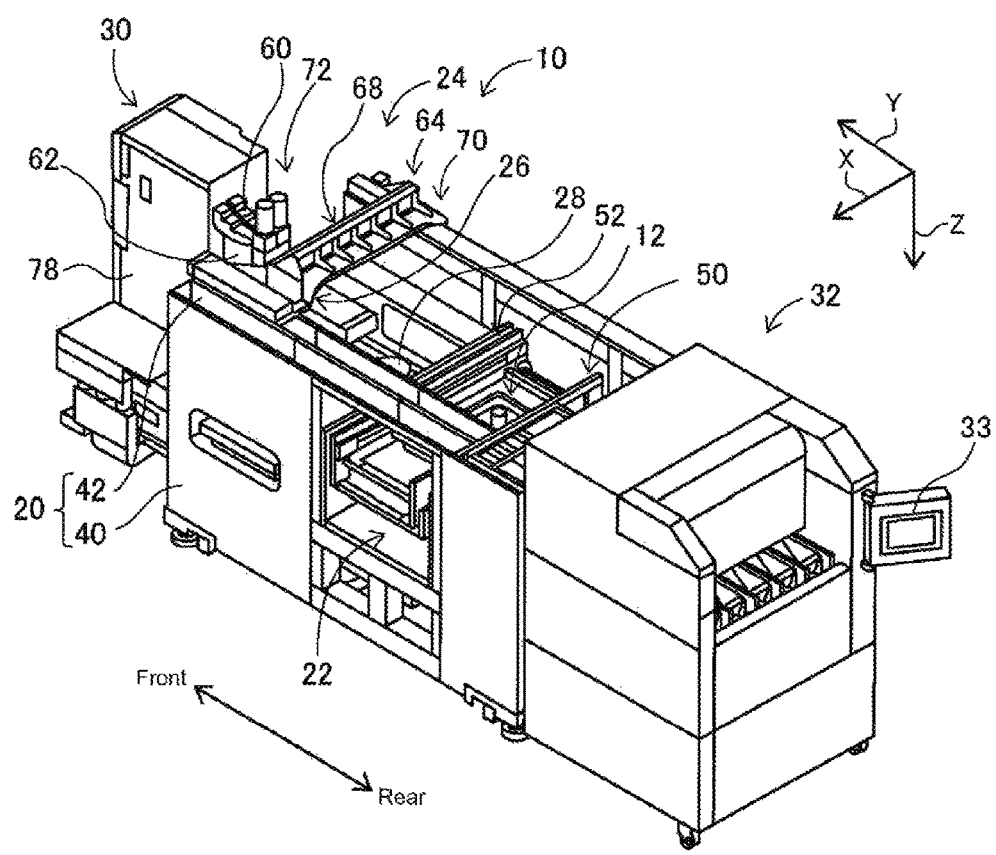
FIG. 1 is a perspective view of a component mounter.

FIG. 1 shows component mounter 10. Component mounter 10 performs work of mounting components on circuit board 12. Component mounter 10 is provided with device main body 20, board conveying and holding device 22, component mounting device 24, mark camera 26, component camera 28, component supply device 30, loose component supply device 32, display device 33, cut and clinch device (refer to FIG. 3) 34, and control device (refer to FIG. 7) 36. Note that, examples of circuit board 12 include circuit boards and boards with a three-dimensional construction, examples of a circuit board being a printed wiring board or a printed circuit board.

Device main body 20 is configured from frame section 40 and beam section 42 that is mounted on the frame section 40. Board conveying and holding device 22 is positioned centrally inside frame section 40 in the front-rear direction, and includes conveyance device 50 and clamp device 52. Conveyance device 50 conveys circuit board 12, and clamp device 52 holds circuit board 12. Thus, board conveying and holding device 22 conveys circuit board 12 and fixedly holds circuit board 12 at a specified position. Note that, in the descriptions below, the conveyance direction of circuit board 12 is referred to as the X direction, the direction horizontally perpendicular to the X direction is referred to as the Y direction, and the vertical direction is referred to as the Z direction. That is, the width direction of component mounter 10 is the X direction, and the front-rear direction is the Y direction.

Figure 2:
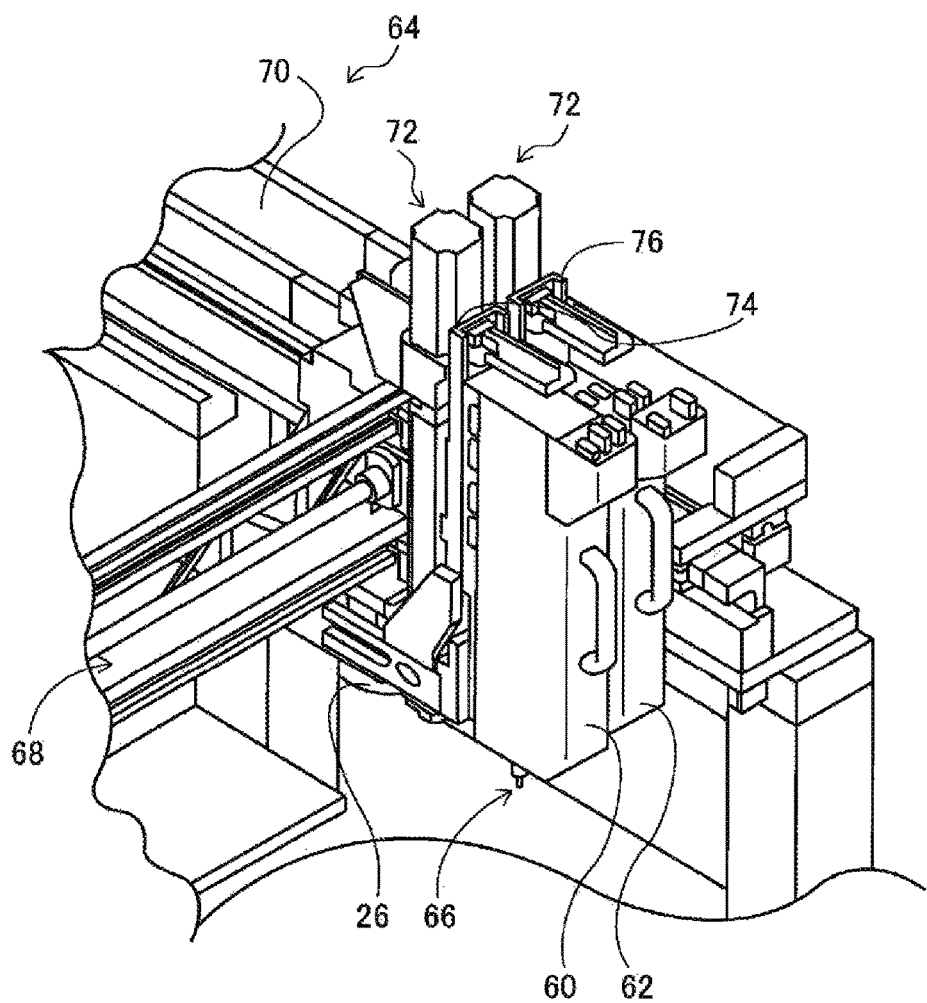
FIG. 2 is a perspective view of a component mounting device.

Component mounting device 24 is provided on beam section 42, and includes work heads 60 and 62 and work head moving device 64. As shown in FIG. 2, suction nozzle 66 is provided on a lower surface of each work head 60 and 62, with a component being picked up and held by the suction nozzle 66. Further, work head moving device 64 includes X-direction moving device 68, Y-direction moving device 70, and Z-direction moving device 72. Work heads 60 and 62 are moved together to any position on frame 40 by X-direction moving device 68 and Y-direction moving device 70. Also, work heads 60 and 62 are detachably attached to sliders 74 and 76 respectively, and Z-direction moving device 72 moves sliders 74 and 76 in a vertical direction individually. That is, work heads 60 and 62 are moved in a vertical direction individually by Z-direction moving device 72.

Mark camera 26 is attached to slide 74 in a state facing downwards, and is moved in the X direction, Y direction, and Z direction together with work head 60. Thus, mark camera 26 images any position on frame section 40. As shown in FIG. 1, component camera 28 is provided in a state facing upwards on frame section 40 between board conveying and holding device 22 and component supply device 30. Thus, component camera 28 images a component held by suction nozzle 66 of work heads 60 or 62.

Component supply device 30 is provided at an end of frame section 40 in the front-rear direction. Component supply device 30 includes tray-type component supply device 78 and feeder-type component supply device (refer to FIG. 7) 80. Tray-type component supply device 78 supplies components in a state arranged in a tray. Feeder-type component supply 80 device supplies components via a tape feeder or stick feeder (not shown).

Loose component supply device 32 is provided at the other end of frame section 40 in the front-rear direction. Loose component supply device 32 lines up multiple components that are in a scattered state, and supplies the components in a lined-up state. That is, this device arranges multiple components that have random orientations to have a specified orientation and supplies the components in the specified orientation. Also, display device 33 is arranged on an end section of loose component supply device 32. Information related to component mounting work by component mounter 10 is displayed on display device 33.

Note that, components supplied by component supply device 30 and loose component supply device 32 may include electronic circuit components, configuration components of solar panels, configuration components of power modules, and the like. Also, electronic circuit components include components with leads and components without leads.

Figure 3:
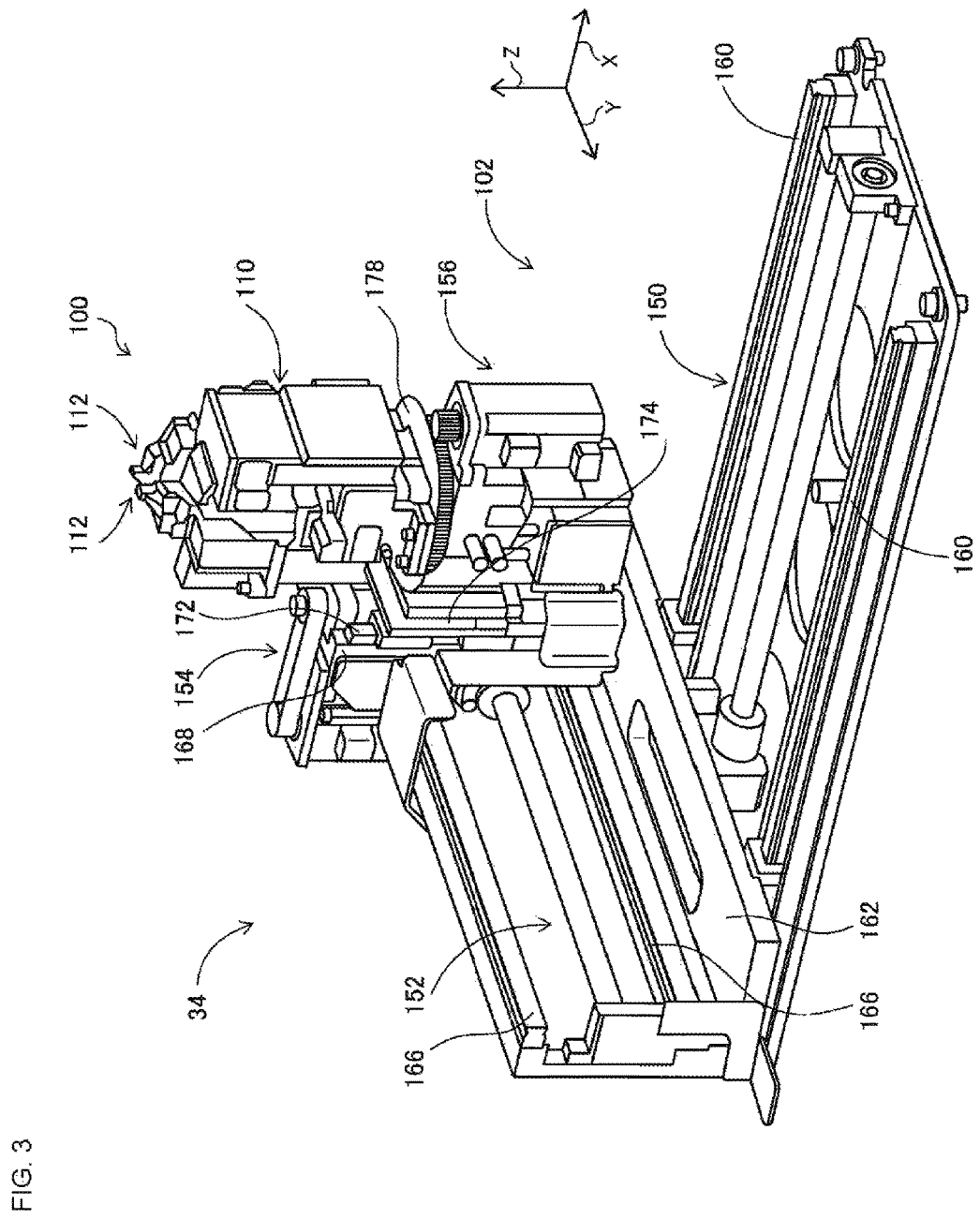
FIG. 3 is a perspective view of a cut and clinch device.
Figure 4:
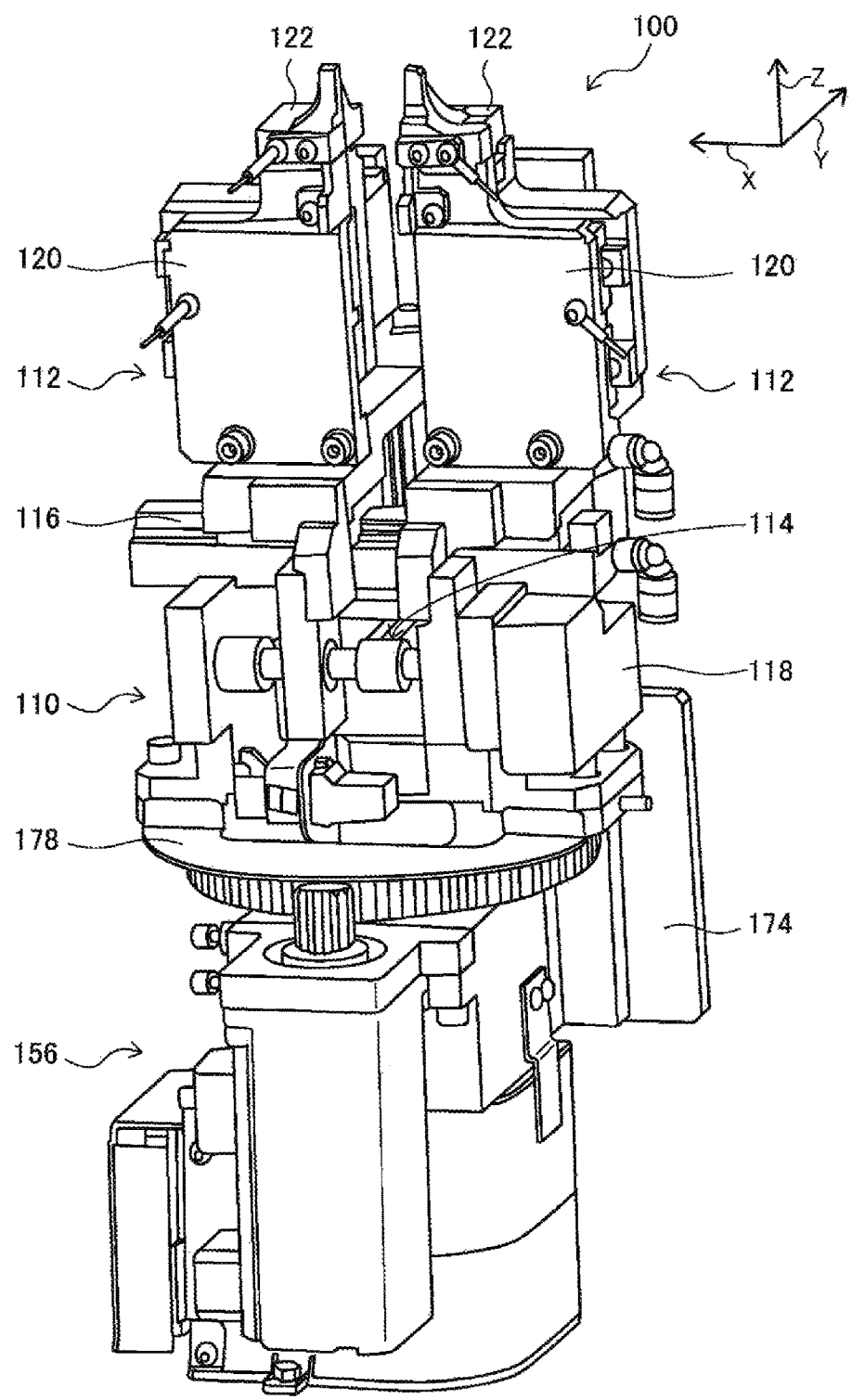
FIG. 4 is a perspective view of a cut and clinch unit.

Cut and clinch device 34 is arranged below conveyance device 50 and, as shown in FIG. 3, includes cut and clinch unit 100 and unit moving device 102. As shown in FIG. 4, cut and clinch unit 100 includes unit main body 110, pair of slide bodies 112, and pitch changing mechanism 114. At an upper end of unit main body 110, slide rail 116 is arranged extending in the X direction. The pair of slide bodies 112 is supported by slide rail 116 so as to be movable. Also, pitch changing mechanism 114 includes electromagnetic motor 118, and the distance between the pair of slide bodies 112 can be controllably changed by operation of electromagnetic motor 118.

Figure 5:
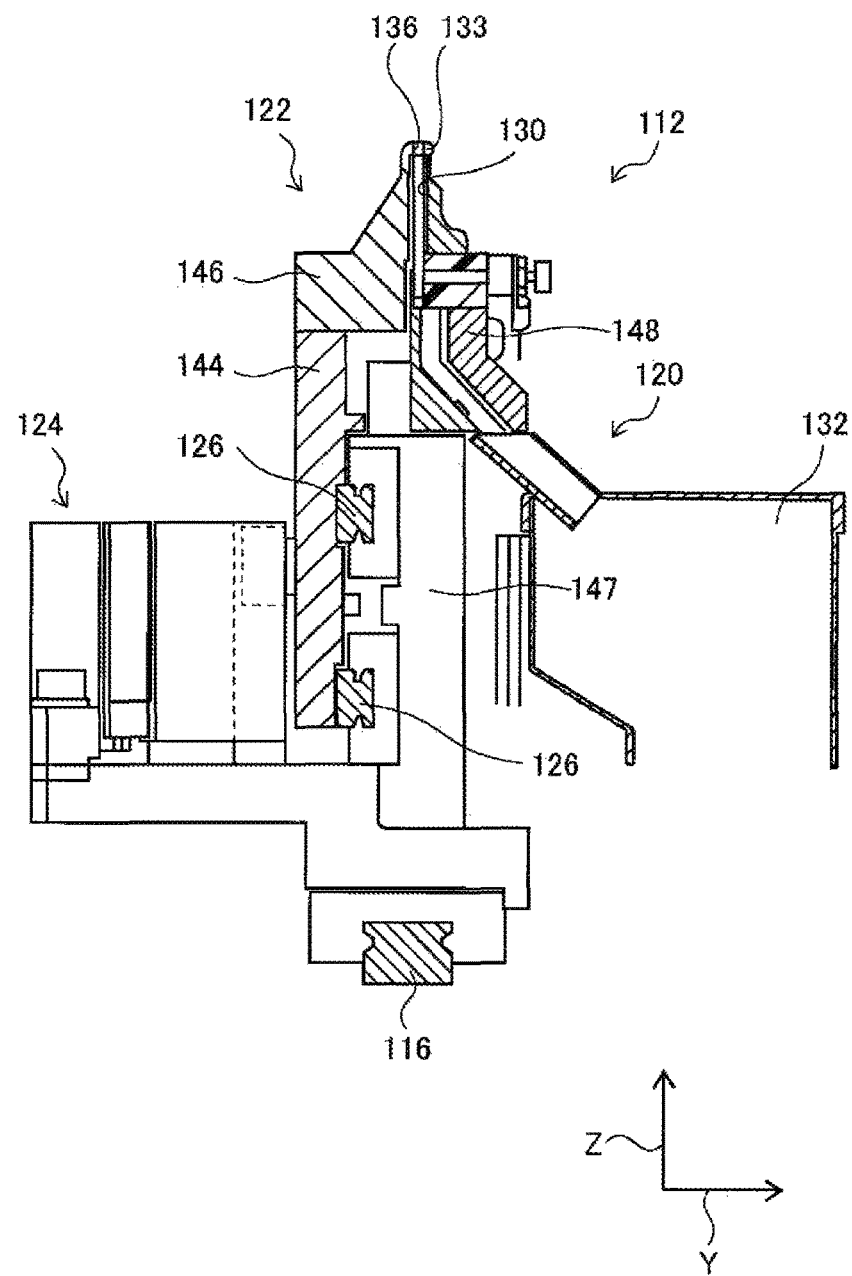
FIG. 5 is a cross section of a slide body.

Also, as shown in FIG. 5, each of the pair of slide bodies 112 includes main body section 120, movable section 122, and slide device 124, and is supported at main body section 120 so as to be slidable on slide rail 116. Two slide rails 126 are fixed to the rear side of main body section 120 extending in the X direction, and movable section 122 is slidably supported by those two slide rails 126. Also, slide device 124 includes electromagnetic motor (refer to FIG. 7) 128, and movable section 122 is controllably slid by operation of electromagnetic motor 128.

Also, the upper end section of main body section 120 is formed tapered towards the end, and first insertion hole 130 is formed so as to pierce the upper end section in a vertical direction. First insertion hole 130 is open at an upper end to an upper end surface of main body section 120, and is open at a lower end to a side surface of main body section 120. Note that, the edge of first insertion hole 130 that opens to the upper end surface of main body section 120 is formed as fixed blade 131 (refer to FIG. 8). Also, below where first insertion hole 130 opens to a side surface of main body section 120, discard box 132 is provided.

Figure 6:
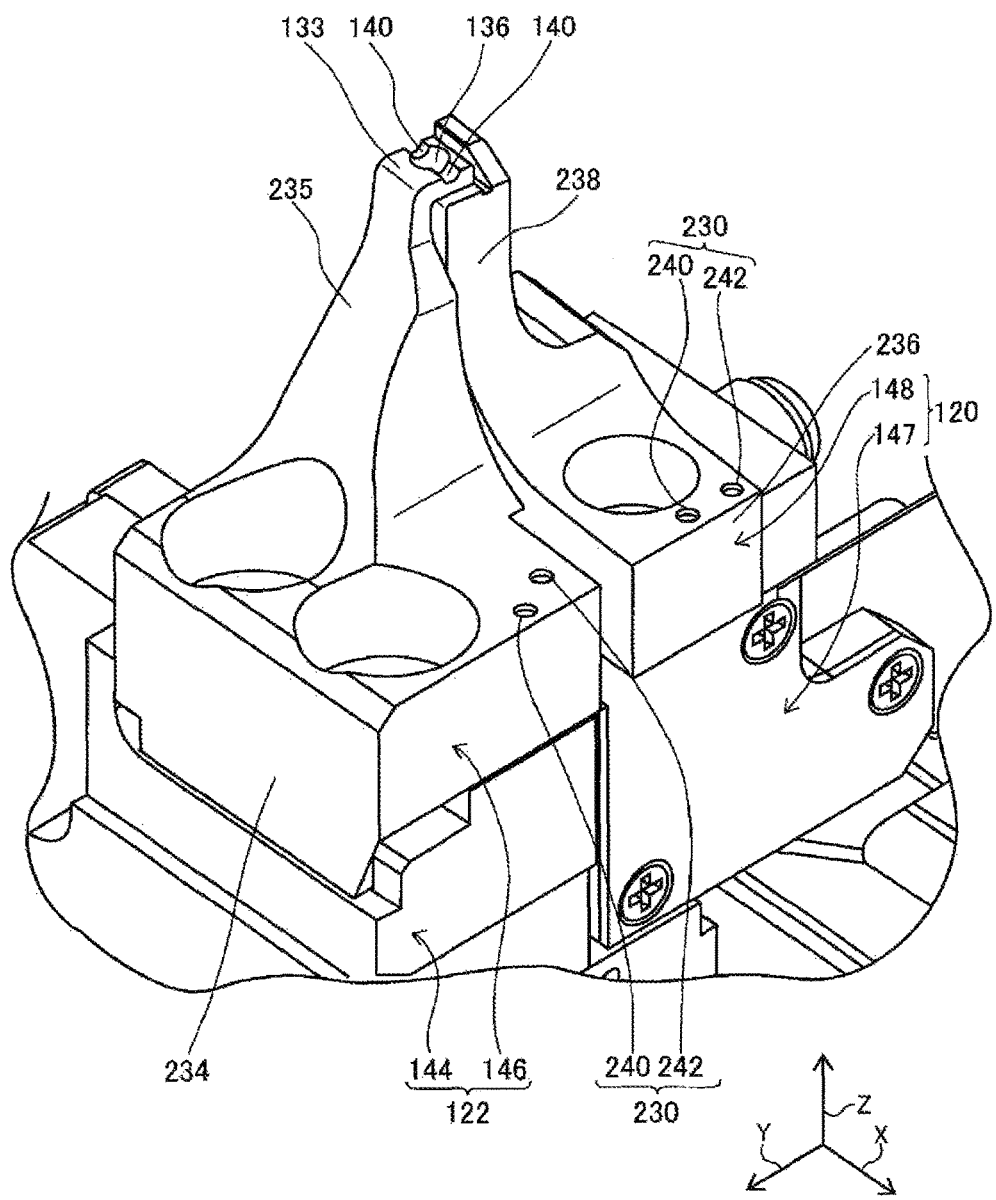
FIG. 6 is an enlarged view of the slide body.

Further, as shown in FIG. 6, an upper end section of movable section 122 is also formed tapered towards the end, and L-shaped curved section 133 is formed at the upper end section of movable section 122. Curved section 133 extends upwards of the upper end surface of main body section 120, and there is slight clearance between curved section 133 and the upper end of main body section 120. And, first insertion hole 130 that opens at the upper end surface of main body section 120 is covered by curved section 133, and second insertion hole 136 is formed in curved section 133 so as to face first insertion hole 130.

Second insertion hole 136 pierces through curved section 133 in a vertical direction, and an internal surface of second insertion hole 136 is a tapered surface configured with a diameter that gets smaller going down. On the other hand, the internal surface of first insertion hole 130 approaching the opening to the upper end surface of main body section 120 is not a tapered surface, the internal surface of insertion hole 130 approaching the opening has an approximately regular diameter. Also, the edge of second insertion hole 136 that opens to the lower end surface of curved section 133 is formed as movable blade 138 (refer to FIG. 8). Note that, guide groove 140 is formed in the upper end surface of curved section 133 extending in the X-axis direction. Guide groove 140 is formed to straddle the opening of second insertion hole 136, and guide groove 140 and second insertion hole 136 are linked.

Also, movable section 122 is configured from movable first section 144 and movable second section 146. Movable first section 144 configures a lower side portion of movable section 122, and as shown in FIG. 5, is slidably supported by slide rail 126. On the other hand, movable second section 146 configures an upper side portion of movable section 122, and includes curved section 133. Movable second section 146 and movable first section 144 are connected by bolts, and it is possible to remove movable second section 146 from movable first section 144 by removing the bolts. Also, main body section 120 is also configured from main body first section 147 and main body second section 148. Main body first section 147 configures a lower side portion of main body section 120, and as shown in FIG. 5, is slidably supported by slide rails 116. On the other hand, main body second section 148 configures an upper side portion of main body section 120 and first insertion hole 130 is formed therein. Main body second section 148 and main body first section 147 are connected by bolts, and it is possible to remove main body second section 148 from main body first second 147 by removing the bolts.

Also, as shown in FIG. 3, unit moving device 102 includes X-direction moving device 150, Y-direction moving device 152, Z-direction moving device 154, and rotating device 156. X-direction moving device 150 includes slide rail 160 and X slider 162. Slide rail 160 extends in the X direction, and X slider 162 is slidably supported on X slide rail 160. X slider 162 moves in the X direction by the driving of electromagnetic motor (refer to FIG. 7) 164. Y-direction moving device 152 includes slide rail 166 and Y slider 168. Slide rail 166 is arranged on X slider 162 extending in the Y direction, and Y slider 168 is slidably supported on slide rail 166. Y slider 168 moves in the Y direction by the driving of electromagnetic motor (refer to FIG. 7) 170. Z-direction moving device 154 includes slide rail 172 and Z slider 174. Slide rail 172 is arranged on Y slider 168 extending in the Z direction, and Z slider 174 is slidably supported on slide rail 172. Z slider 174 moves in the Z direction by the driving of electromagnetic motor (refer to FIG. 7) 176.

Further, rotating device 156 includes rotating table 178 that is roughly disc-shaped. Rotating table 178 is supported by Z slider 174 so as to be rotatable around its own center, and is rotated by the driving of electromagnetic motor (refer to FIG. 7) 180. Cut and clinch unit 100 is arranged on rotating table 178. According to such a configuration, cut and clinch unit 100 can be moved to any position by X-direction moving device 150, Y-direction moving device 152, and Z-direction moving device 154, and can be rotated to any angle by rotating device 156. Thus, second insertion hole 136 of cut and clinch unit 100 can be positioned at any position under circuit board 12 held by clamp device 52.

Figure 7:
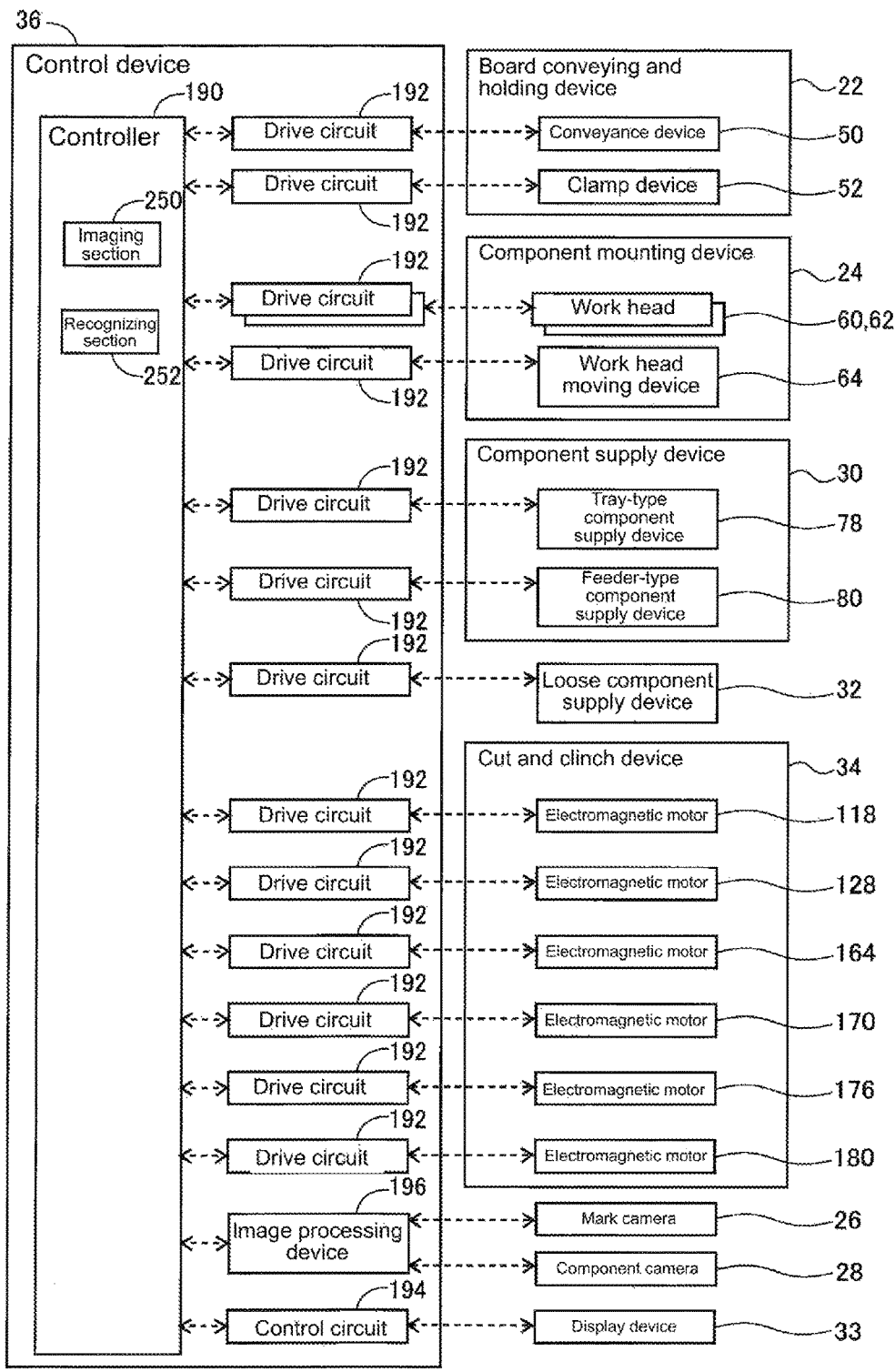
FIG. 7 is a block diagram showing a control device.

As shown in FIG. 7, control device 36 is provided with controller 190, multiple drive circuits 192, control circuit 194, and image processing device 196. The multiple drive circuits 192 are connected to conveyance device 50, clamp device 52, work heads 60 and 62, work head moving device 64, tray type component supply device 78, feeder type component supply device 80, loose component supply device 32, and electromagnetic motors 118, 128, 164, 170, 176, and 180. Controller 190 is provided with a CPU, ROM, RAM, and so on, is formed mainly from a computer, and is connected to the multiple drive circuits 192. By this, operation of board conveying and holding device 22, component mounting device 24, and so on is controlled by controller 190. Also, controller 190 is connected to display device 33 via control circuit 194, and specified images are displayed on display device 33 by controller 190. Further, controller 190 is also connected to image processing device 196. Image processing device 196 is for processing image data acquired by mark camera 26 and component camera 28, and controller 190 acquires various information from the image data.

Component Mounter Operation

Component mounter 10, according to the above configuration, mounts components on circuit board 12 held by board conveying and holding device 22. With component mounter 10, it is possible to mount various components to circuit board 12; descriptions are given below of a case in which components with leads (hereinafter also referred to as "leaded component") are mounted on circuit board 12.

Figure 8:
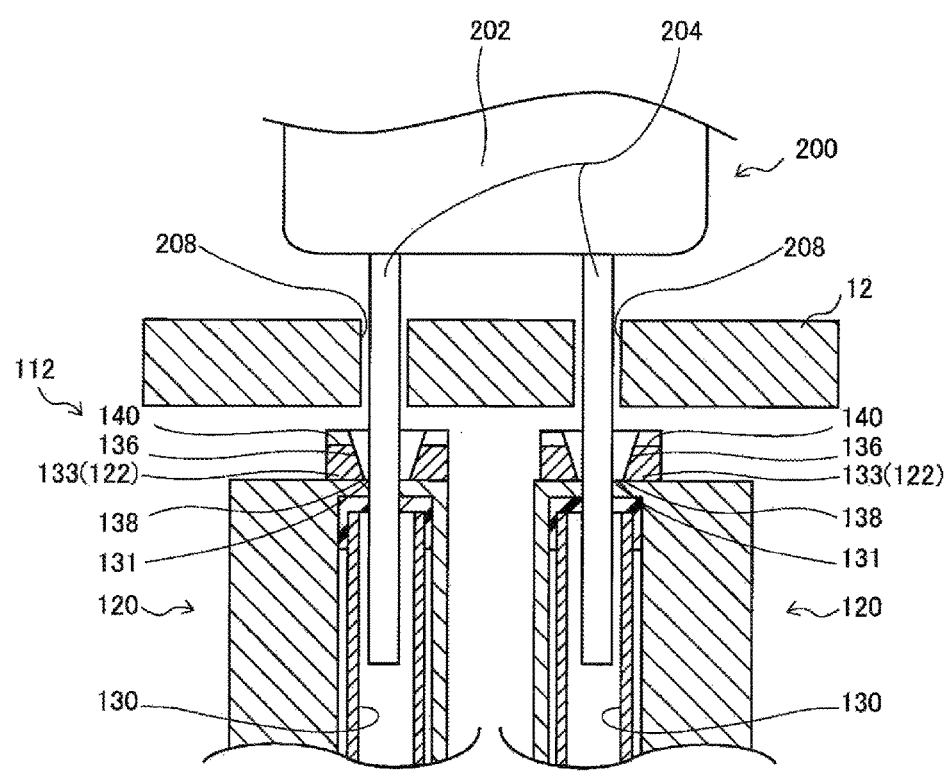
FIG. 8 is a schematic view of a cut and clinch unit immediately before a lead of a leaded component is cut.

Specifically, circuit board 12 is conveyed to a work position, and is fixedly held at that position by clamp device 52. Next, mark camera 26 moves above circuit board 12 and images circuit board 12. By this, information related to a holding position of circuit board 12 is obtained. Also, component supply device 30 or loose component supply device 32 supplies components at a specified supply position. One of the work heads 60 or 62 moves above the component supply position and holds a component using suction nozzle 66. Note, as shown in FIG. 8, leaded component 200 is configured from component main body section 202, and two leads 204 protruding from the bottom surface of component main body section 202. Leaded component 200 is picked up and held by a suction nozzle 66 on component main body section 202.

Continuing, work head 60 or 62 holding leaded component 200 is moved above component camera 28, and leaded component 200 held by suction nozzle 66 is imaged by component camera 28. Accordingly, information related to the holding position of the component is obtained. Continuing, work head 60 or 62 holding leaded component 200 moves above circuit board 12, and corrects the error in the holding position of circuit board 12 and the error in the holding position of the component and so on. Then, the two leads 204 of leaded component 200 held by suction nozzle 66 are inserted into two through-holes 208 formed in circuit board 12. Here, cut and clinch unit 100 is moved below circuit board 12. Cut and clinch unit 100 is moved such that coordinates in the XY directions of second insertion hole 136 of movable section 122 and coordinates in the XY directions of through-holes 208 of circuit board 12 match, the upper surface of movable section 122 and the lower surface of circuit board 12 do not contact each other, and the upper surface of movable section 122 is slightly below the lower surface of circuit board 12.

Specifically, with cut and clinch unit 100, the distance between the pair of slide bodies 112 is adjusted by pitch changing mechanism 114 such the distance between the pair of second insertion holes 136 of movable section 122 of slide body 122 is the same as the distance between the two through-holes 208 formed in circuit board 12. And, by operation of unit moving device 102, cut and clinch unit 100 is moved in the XYZ directions and rotated. Thus, the coordinates in the XY directions of second insertion hole 136 of movable section 122 and coordinates in the XY directions of through-holes 208 of circuit board 12 match, the upper surface of movable section 122 and the lower surface of circuit board 12 do not contact each other, and the upper surface of movable section 122 is slightly below the lower surface of circuit board 12.

Then, when leads 204 of leaded component 200 held by suction nozzle 66 are inserted into through-holes 208 of circuit board 12, as shown in FIG. 8, the end section of leads 204 is inserted into first insertion hole 130 of main body section 120 through second insertion hole 136 of movable section 122 of cut and clinch unit 100. Here, because the internal surface of second insertion hole 136 positioned below through-hole 208 is tapered, even in a case in which lead 204 is bent slightly, it is possible to ensure that the tip section of lead 204 appropriately enters second insertion hole 136.

Figure 9:
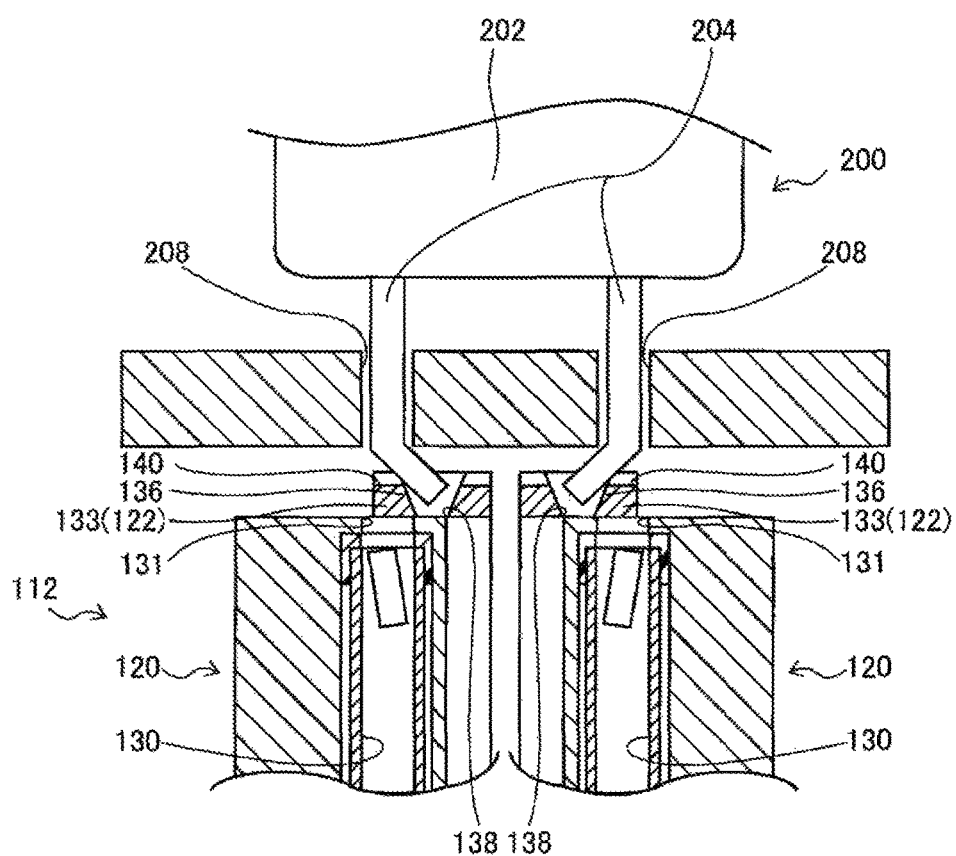
FIG. 9 is a schematic view of a cut and clinch unit after a lead of a leaded component has been cut.

Next, when the tip section of lead 204 has been inserted into first insertion hole 130 of main body section 120, movable section 122 is slid by operation of slide device 124. Thus, as shown in FIG. 9, lead 204 is cut by fixed blade 131 of first insertion hole 130 and movable blade 138 of second insertion hole 136. Then, the tip section separated by the cutting of lead 204 falls inside first insertion hole 130 and is discarded in discard box 132. Also, the new tip section formed by the cutting of lead 204 is bent along the tapered surface of the inside of second insertion hole 136 in accordance with the sliding of movable section 122, and the tip section of lead 204 is bent along guide groove 140 by the further sliding of movable section 122. Thus, leaded 200 component is mounted into circuit board 12 in a state in which leads 204 are prevented from coming out of through-holes 208.

In this manner, with component mounter 10, leaded component 200 is mounted into circuit board 12 by lead 204 being cut and bent by cut and clinch device 34. When lead 204 is being cut and bent by cut and clinch device 34, lead 204 is inserted into first insertion hole 130 and second insertion hole 136, with first insertion hole 130 and second insertion hole 136 being formed in accordance with the wire diameter of lead 204. Thus, multiple types of main body second section of main body section 120 and movable second section of movable section 122 are prepared, and when the leaded component 200 that is the target for mounting work is changed, the main body second section and movable second section are changed in accordance with the wire diameter of leads 204.

Specifically, for example, movable second section (refer to FIG. 10) 210 and main body second section (refer to FIG. 10) 212 that differ from movable second section 146 and main body second section 148 shown in FIG. 6 are prepared. Movable second section 210 is roughly the same shape as movable second section 146, except for second insertion hole 214. Also, main body second section 212 is roughly the same shape as main body second section 148, except for first insertion hole 216. Therefore, in a case in which the mounting target component is leaded component 200 including lead 204 with a wire diameter in accordance with second insertion 214 and first insertion hole 216, movable second section 146 is removed from movable first section 144, movable second section 210 is attached to movable first section 144 instead of movable second section 146. Also, main body second section 148 is removed from main body first section 147, and main body second section 212 is attached to main body first section 147 instead of main body second section 148.

Figure 11:
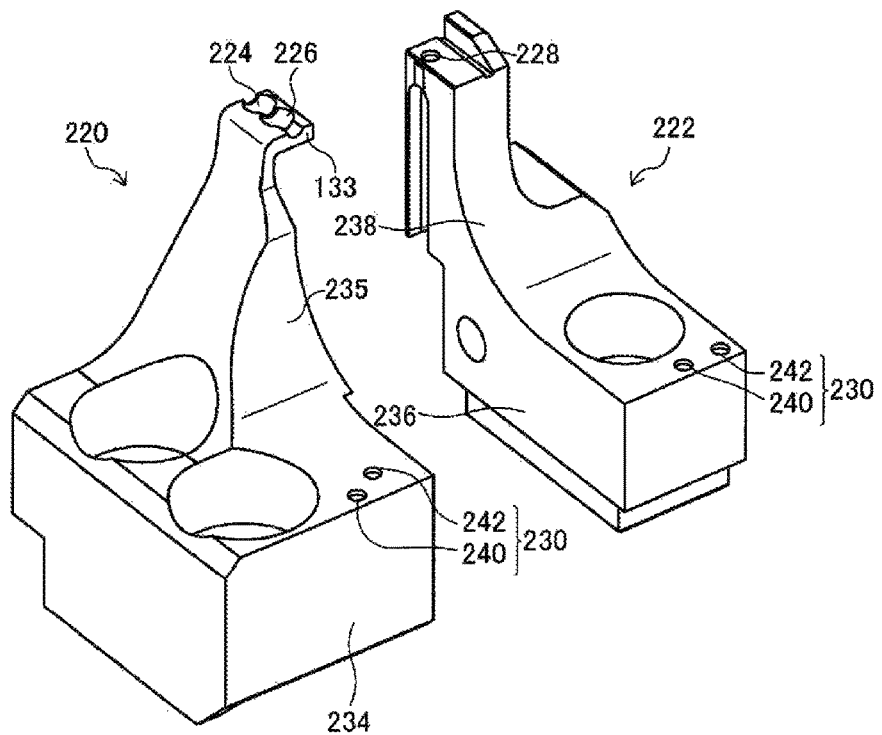
FIG. 11 is a perspective view showing an exchange-use movable second section and a main body second section.

Also, movable second section 220 and main body second section 222 shaped as shown in FIG. 11 are prepared. Two second insertion holes 224 and 226 are formed in movable second section 220. Also, first insertion hole 228 shaped in accordance with second insertion holes 224 and 226 is formed in main body second section 222. Then, in a state with second insertion hole 224 and first insertion hole 228 overlapping, movable second section 220 is slid one way in the X direction. As a result, lead 204 is inserted into second insertion hole 224 and first insertion hole 228, and by movable second section 220 being slid, lead 204 is cut and bent in that direction. Then, in a state with second insertion hole 226 and first insertion hole 228 overlapping, movable second section 220 is slid the opposite way in the X direction. As a result, lead 204 is inserted into second insertion hole 226 and first insertion hole 228, and by movable second section 220 being slid, lead 204 is cut and bent in that direction. That is, using movable second section 220 and main body second section 222, it is possible to bend lead 204 either one way or the opposite way in the X direction as desired. Therefore, to change the bending direction of lead 204, movable second section 220 is attached to movable first section 144 instead of movable second section 146, and main body second section 222 is attached to main body first section 147 instead of main body second section 148.

In this manner, movable second sections and main body second sections are exchanged in accordance with the bending direction of lead 204 and the wire diameter of lead 204 of leaded component 200 to be mounted. However, because exchange of movable second sections and main body second sections is performed by an operator, there is a worry that the movable second section and main body second section attached to movable first section 144 and main body first section 147 will be different to the planned movable second section and main body second section. Considering this, recognition marks (refer to FIGS. 6, 10, and 11) 230 are provided on each of movable second sections 146, 210, and 220, and on main body second sections 148, 212, and 222, and recognition of movable second sections 146, 210, and 220, and main body second sections 148, 212, and 222 is performed based on image data of recognition marks 230.

Figure 10:
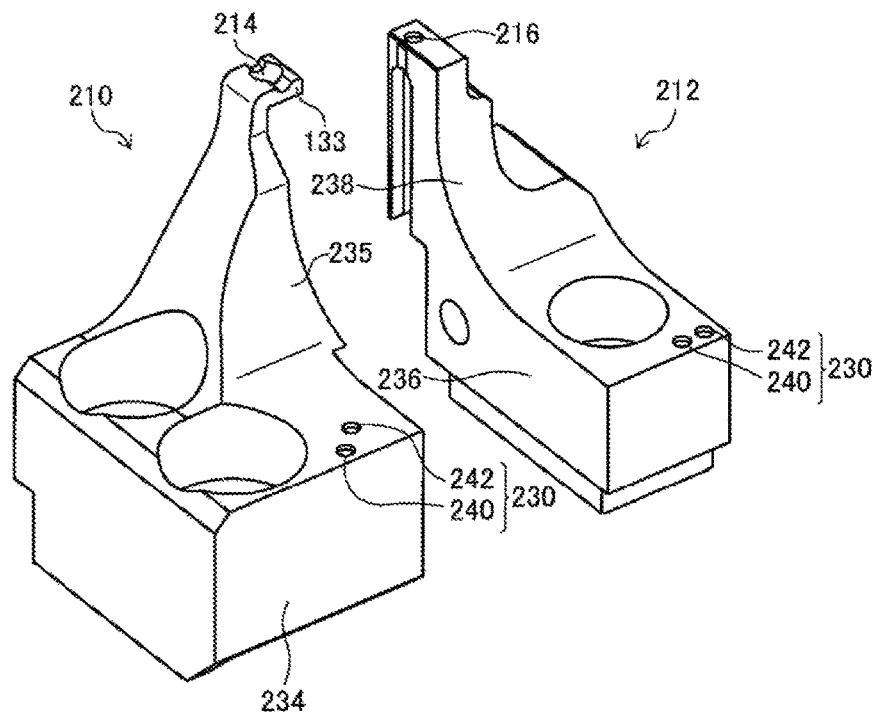
FIG. 10 is a perspective view showing an exchange-use movable second section and a main body second section.

In detail, as shown in FIGS. 6, 10, and 11, movable second sections 146, 210, and 220 are configured from base section 234 and upright section 235. Base section 234 is a location fixed to movable first section 144, and upright section 235 protrudes upwards from an upper surface of base section 234. Curved section 133 is formed on an upper end section of upright section 235, and second insertion holes 136, 214, 224, and 226 are formed in curved section 133. Also, main body second sections 148, 212, and 222 are configured from base section 236 and upright section 238. Base section 236 is a location fixed to main body first section 147, and upright section 238 protrudes upwards from an upper surface of base section 236. First insertion holes 130, 216, and 228 are formed in an upper surface of upright section 238. And, recognition marks 230 are provided on an upper surface of base section 234 of movable second sections 146, 210, and 220, and on an upper surface of base section 236 of main body second sections 148, 212, and 222.

Recognition mark 230 is configured from two recesses 240 and 242. And, the two recesses 240 and 242 are imaged by mark camera 26 and the image data is analyzed by controller 190. However, mark camera 26 is for imaging circuit board 12, and is adjusted such that the focal point is at circuit board 12. Conversely, base sections 234 and 236 on which recognition marks 230 are provided are positioned above circuit board 12, with the distance between circuit board 12 and base sections 234 and 236 being longer than the vertical length of upright sections 235 and 238. Therefore, recognition marks 230 are positioned outside the field of depth of mark camera 26, and it is difficult to capture a clear image of recognition marks 230 using mark camera 26. However, as described above, because recognition marks 230 are configured from two recesses 240 and 242, even without a clear image, it is possible to recognize a positional relationship between the two recesses 240 and 242. Therefore, in controller 190, image data of the two recesses 240 and 242 is analyzed, and the relative positions in the X direction and Y direction of the two recesses 240 and 242, and the distance (separation distance) between the two recesses 240 and 242 are calculated.

Further, links between the types of movable second sections 146, 210, and 220, and main body second sections 148, 212, and 222; and the relative positions and separation distances of recesses 240 and 242 are memorized in controller 190 as map data. Therefore, with controller 190, the types of movable second sections 146, 210, and 220, and main body second sections 148, 212, and 222 that match the calculated relative position and separation distance of recesses 240 and 242 are extracted from the map data. Thus, recognition is performed of the movable second section 146, 210, and 220, and main body second section 148, 212, and 222 attached to movable first section 144, and main body first section 147.

Here, in a case in which movable second sections 146, 210, and 220 and main body second sections 148, 212, and 222 of types in accordance with the mounting work are attached to movable first section 144 and main body first section 147, a comment indicating that fact is displayed on display device 33. On the other hand, in a case in which movable second sections 146, 210, and 220 and main body second sections 148, 212, and 222 of types different to the types in accordance with the mounting work are attached to movable first section 144 and main body first section 147, a comment indicating that fact, and information related to the types of movable second sections 146, 210, and 220 and main body second section 148, 212, and 222 in accordance with the mounting work are displayed on display device 33.

In this manner, with component mounter 10, by performing recognition of movable second sections 146, 210, and 220 and main body second sections 148, 212, and 222 attached to movable first section 144 and main body first section 147 based on image data of recognition marks 230, attachment mistakes by operators can be prevented. Note that, checking work of movable second sections 146, 210, and 220 and main body second section 148, 212, and 222 is performed when an operating switch for starting component mounter 10 is operated, before starting a new production program, and before the loading of a new circuit board to component mounter 10. Therefore, in a case in which movable second sections 146, 210, and 220 and main body second sections 148, 212, and 222 of different types to the types in accordance with the mounting work are attached to movable first section 144 and main body first section 147, by displaying that fact on display device 33, it is possible to prevent a new production program from being started, or a new circuit board from being loaded.

Note that, as shown in FIG. 7, controller 190 of control device 36 includes imaging section 250 and recognizing section 252. Imaging section 250 is a functional section for imaging recognition marks 230 using mark camera 26. Recognizing section 252 is a functional section for recognizing the types of movable second sections 146, 210, and 220 and main body second sections 148, 212, and 222 based on image data.

Component mounter 10 is an example of a board work machine. Mark camera 26 is an example of an imaging device. Cut and clinch device 34 is an example of a cutting device. Control device 36 is an example of a control device. First insertion holes 130, 216, 228 are examples of an insertion hole. Second insertion holes 136, 214, 224, and 226 are examples of an insertion hole. Movable first section 144 is an example of a main body section. Movable second sections 146, 210, and 220 are examples of a cutting tool. Main body first section 147 is an example of a main body section. Main body second sections 148, 212, and 222 are examples of a cutting tool. Leaded component 200 is an example of a leaded component. Lead 204 is an example of a lead. Recognition mark 230 is an example of a recognition mark. Recesses 240 and 242 are examples of a symbol. Imaging section 250 is an example of an imaging section. Recognizing section 252 is an example of a recognizing section. A process performed by imaging section 250 is an example of an imaging process. A process performed by recognizing section 252 is an example of a recognizing process.

Further, the present invention is not limited to the above example embodiments, and various changed or improved methods of embodiment are possible based on the knowledge of someone skilled in the art. Specifically, for example, in an embodiment above, recesses 240 and 242 are used as recognition marks 230 provided on movable second sections 146, 210, and 220 and main body second section 148, 212, and 222, but various shapes such as circles, triangles, squares, stars, or the like may be used. Also, in an embodiment above, the types of movable second sections 146, 210, and 220 and main body second section 148, 212, and 222 are recognized based on the positional relationship between two recesses 240 and 242, but movable second sections 146, 210, and 220 and main body second section 148, 212, and 222 may be recognized based on the contrast, color, and so on of recesses 240 and 242. Further, a 2D code or the like may be used as recognition mark 230. However, in a case in which a 2D code or the like is used, the 2D code or the like must be provided within the field of depth of mark camera 26.

REFERENCE SIGNS LIST

10: component mounter (board work machine); 26: mark camera); 34: cut and clinch device (cutting device); 38: control device; 130: first insertion hole; 136: second insertion hole; 144: movable first section (main body section); 146: movable second section (cutting tool); 147: main body first section (main body section); 148: main body second section (cutting tool); 200: leaded component; 204: lead; 210: movable second section (cutting tool); 212: main body second section (cutting tool); 214: second insertion hole; 216: first insertion hole; 220: movable second section (cutting tool); 222: main body second section (cutting tool); 224: second insertion hole; 226: second insertion hole; 228: first insertion hole; 230: recognition mark; 240: recess (symbol); 242: recess (symbol); 250: imaging section; 252: recognizing section

The invention claimed is:

1. A board work machine comprising:
a cutting device including
a cutting tool configured to cut a lead of a leaded component inserted into an insertion hole formed in the cutting tool, and
a main body section to which the cutting tool is removably attached;
an imaging device; and
a control device,
wherein
a mark for recognizing a type of the cutting tool is provided on the cutting device, and
the control device includes
an imaging section configured to capture an image of the recognition mark using the imaging device, and
a recognizing section configured to recognize the type of the cutting tool based on image data obtained from the imaging section.

2. The board work machine according to claim 1, wherein
the recognition mark is multiple symbols provided outside a depth of field of the imaging device, and
the recognizing section is configured to recognize the type of the cutting tool based on image data of the multiple symbols obtained from the imaging section.

3. A method comprising:
providing a recognition mark on a body section of a cutting tool, the recognition mark being indicative of a type of the cutting tool;
imaging the recognition mark provided on the cutting tool using an imaging device, the cutting tool being included in a cutting device including the cutting tool configured to cut a lead of a leaded component inserted into an insertion hole formed in the cutting tool, and a main body section to which the cutting tool is removably attached;
recognizing the type of the cutting tool based on image data obtained from the imaging;
confirming the type of the cutting tool that has been recognized; and
operating the confirmed cutting tool so as to cut the lead of the leaded component inserted into the insertion hole formed in cutting tool.

4. The method according to claim 3, wherein
the recognition mark is multiple symbols provided outside a depth of field of the imaging device, and
the type of the cutting tool is recognized based on image data of the multiple symbols obtained from the imaging.

* * * * *